United States Patent
Qiao et al.

(10) Patent No.: US 10,910,362 B2
(45) Date of Patent: Feb. 2, 2021

(54) HIGH VOLTAGE ESD PROTECTION DEVICE

(71) Applicant: University of Electronic Science and Technology of China, Chengdu (CN)

(72) Inventors: Ming Qiao, Chengdu (CN); Zhao Qi, Chengdu (CN); Jiamu Xiao, Chengdu (CN); Longfei Liang, Chengdu (CN); Danye Liang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/017,978

(22) Filed: Jun. 25, 2018

(65) Prior Publication Data
US 2019/0304966 A1    Oct. 3, 2019

(30) Foreign Application Priority Data
Mar. 30, 2018    (CN) .......................... 2018 1 0275990

(51) Int. Cl.
| H01L 27/02 | (2006.01) |
| H01L 29/10 | (2006.01) |
| H01L 29/78 | (2006.01) |
| H01L 29/08 | (2006.01) |

(52) U.S. Cl.
CPC ...... H01L 27/0277 (2013.01); H01L 29/0865 (2013.01); H01L 29/0882 (2013.01); H01L 29/1095 (2013.01); H01L 29/7816 (2013.01)

(58) Field of Classification Search
None
See application file for complete search history.

(56) References Cited

U.S. PATENT DOCUMENTS

2017/0062406 A1 * 3/2017 Ko ...................... H01L 29/7436

* cited by examiner

*Primary Examiner* — Nicholas J Tobergte
*Assistant Examiner* — Kien C Ly
(74) *Attorney, Agent, or Firm* — Bayramoglu Law Offices LLC

(57) ABSTRACT

The present invention provides a high voltage ESD protection device including a P-type substrate; a first NWELL region located on the left of the upper part of the P-type substrate; an NP contact region located on the upper part of the first NWELL region; an N+ contact region located on the right of the upper part of the P-type substrate apart from the first NWELL region; a P+ contact region tangential to the right side of the N+ contact region; a NTOP layer arranged on the right of the NP contact region inside the first NWELL region. The NP contact region is connected to a metal piece to form a metal anode. The N+ contact region and the P+ contact region are connected by a metal piece to form a metal cathode.

10 Claims, 9 Drawing Sheets

HIGH VOLTAGE ESD PROTECTION DEVICE

CROSS REFERENCE TO RELATED APPLICATIONS

The present application is based on and claims priority from Chinese application number CN2018102759908, filed on Mar. 30, 2018, the disclosure of which is hereby incorporated by reference herein in its entirety.

TECHNICAL FIELD

The present invention belongs to the technical field of electronic science which mainly relates to an electrostatic discharge (ESD) protection technology of the integrated circuit chips, particularly to ESD protection devices of a category that is used in high voltage integrated circuits with low power consumption and strong ability of anti-latch-up.

BACKGROUND

ESD means "electrostatic discharge" and is a common phenomenon in nature. ESD exists in every corner of people's everyday life. But the usual electrical phenomenon can be a fatal threat in the world of sophisticated integrated circuits. However, for a packaged chip, each power/input/output pin becomes the entry channel of the pulse current of the human body model (HBM), machine model (MM), and human metal model (HMM). Strong ESD pulses will not only cause hard failure of chips, but also induce various effects caused by improper design of ESD protection devices (such as latch-up, soft leakage). Besides, in the process of the chip manufacturing, only little ESD failures can be detected directly. Most ESD damage does not have obvious effects on the performance of chips, so chips with ESD damage can pass the quality assurance testing phase and into the market. This kind of chip has problems in various applications, thereby threatening the reliability of the chip's system.

For the high voltage integrated circuits, with the existence of the latch-up like effect, the LDMOS structure (shown in FIG. 1) is usually not directly used for ESD protection. However, the holding voltage of LDMOS can be raised above VDD voltage in some ways to meet the conventional design window of ESD protection device. Although the design of high-holding voltage can eliminate the latch-up phenomenon, since the voltage that the device withstands in this state is increased, while the power is also increased. What's more, with the influence of the Kirk effect under large current, the robustness of LDMOS will be greatly reduced.

To make the LDMOS more robust, a multi-finger layout design can improve the robustness of ESD linearly. However, each of the fingers may not open synchronously because of strong snapback and effects such as the process error. Therefore, more relative technologies (such as ESD gate coupling technology as proposed in IEDM) are used to solve the problem. However, for chips applied with high-voltage application, which require strong ESD quality, the area of the ESD device on the chips may be large, thereby increasing manufacturing costs.

Therefore, the area of ESD device layout, the avoidance of latch-up and strong ESD robustness constitute an uneasy contradiction. It means that the robustness will decrease while needing latch-up immune and to improve the ESD robustness of latch-up immune devices, the area of the ESD device needs to be increased.

To solve this problem, the research indicates that by increasing of the holding current, the latch-up-like problems can be resolved in the device to some extent. If the maximum current provided by the power supply is unable to meet the minimum holding current requirement of the ESD device, the latch-up effect will not occur. This provides a new idea for the design of low-holding voltage ESD protection devices without latch-up. The ESD protection device breaks through the conventional high holding voltage design window, and is designed by using a high holding current design window. Therefore, the holding voltage of this device is lower than the conventional high holding voltage ESD protection device, the power consumption when discharging ESD pulses also decreases, thereby improving the ESD robustness of the device. Specifically, based on the conventional LDMOS, the present invention realizes the characteristics of adjustable trigger voltage and holding current, low discharge power, and high robustness through a layer of high concentration NTOP layer without changing the process conditions.

SUMMARY

The problem to be solved by the present invention is to achieve an accurate and rapid triggering of the ESD device (proper trigger voltage), high holding current, and low ESD power consumption using a certain process.

In order to achieve the above-mentioned invention purpose, the technical scheme of the present invention is as follows.

A high voltage ESD protection device includes: a P-type substrate, a first NWELL region located on the left of an upper part of the P-type substrate; a NP contact region located on an upper part of the first NWELL region; an N+ contact region arranged on the right of the upper part of the P-type substrate apart from the first NWELL region; a P+ contact region tangent to the right side of the N+ contact region; and finally an NTOP layer arranged on the right of the NP contact region inside the first NWELL region. The NP contact region is connected to a first metal piece to form a metal anode next the N+ contact region and the P+ contact region are connected by a second metal piece to form a metal cathode.

Preferably, the right of the upper part of the P-type substrate is provided with a first PWELL region, the left side of the first PWELL region is tangent to the first NWELL region, and the N+ contact region and the P+ contact region are located inside the first PWELL region.

Preferably, the upper surface of the first PWELL region is provided with a gate oxide layer, the left side of the gate oxide layer is tangent to the first NWELL region and the NTOP layer, and the right side of the gate oxide layer is tangent to the N+ contact region, and polysilicon or a metal gate is provided above the gate oxide layer.

Preferably, the NTOP layer is a continuous region.

Preferably, the NTOP layer is located on the upper surface of the first NWELL region and includes multiple discontinuous regions.

Preferably, the NP contact region and NTOP layer are connected to form a first N+ contact region. The left side of the N+ contact region is provided with a first P+ contact region, and the right side of the first NWELL region is provided with a second NWELL region apart from the first NWELL region. The N+ contact region and P+ contact region are located inside the second NWELL region. The first N+ contact region and the first P+ contact region are shortened to form the metal anode, and the N+ contact region and the P+ contact region is connected by a metal piece to form the metal cathode.

Preferably, the first NWELL region and the second NWELL region and their internal structures are symmetrical with respect to the axis of the device.

Preferably, a second PWELL region is arranged between the first NWELL region and the second PWELL region. The left edge of the second PWELL region is tangential to the first NWELL region, and the right edge of the second PWELL is tangential to the second NWELL region.

Preferably, a first low-trigger region is arranged on the upper surface at the boundary of the first NWELL region and the second PWELL region. A part of the first low-trigger region is located inside of the first NWELL region and the other part of the first low-trigger region is located in the second PWELL region. Symmetrically, a second NWELL region is arranged on the upper surface at the boundary of the second PWELL region and the second NWELL region. A part of the second low-trigger region is located inside of the second NWELL region and the other part is located in the second PWELL region.

Preferably, a first NTOP region is arranged between the first N+ contact region and the first low-trigger region. The first NTOP region is located on the upper surface of the first NWELL region and is not tangent to the first N+ contact region and the first low-trigger region at the same time. Symmetrically, a second NTOP region is arranged between the N+ contact region and the second low-trigger region. The second NTOP region is located on the upper surface of the second NWELL region, and the second NTOP region is not tangent to the N+ contact region and the second low-trigger region at the same time.

Preferably, each type of doping in the ESD device becomes opposite doping, i.e., P-type doping becomes N-type doping, while N-type doping becomes P-type doping.

The advantages of the present invention are as follows:

1. The present invention proposes that the LDMOS device can adjust the trigger voltage through the position of the NTOP layer without changing the process.

2. On one hand, the change of the position of the NTOP layer can adjust the trigger voltage, on the other hand the change of the position of the NTOP layer can increase the holding current to avoid the latch-up effect.

3. The existence of the NTOP layer can change the current distribution, thereby making the IV curve of the device exhibit multiple snapback characteristics and improve the robustness of the device under ESD pulse current.

BRIEF DESCRIPTION OF THE DRAWINGS

FIG. 1 (b) is a design window of high holding current ESD;

Among them, 01 is the p-type substrate, 02 is the gate oxide integration, 03 is the gate, 10 is the first NWELL region, 11 is the NP contact region, 12 is the N+ contact region, 13 is the NTOP layer, and 20 is the first PWELL region, 21 is the P+ contact region, 30 is the second NWELL region, 31 is the metal anode, 32 is the metal cathode, 40 is the second PWELL region, 121 is the first N+ contact region, 131 is the first low-trigger region, 132 is the second low-trigger region, 141 is the first NTOP region, 142 is the second NTOP region, 211 is the first P+ contact region, and 212 is the second P+ contact region.

DETAILED DESCRIPTION

The embodiments of the present invention are described through the following specific examples, and those skilled in the art can easily understand more advantages and effects of the present invention by reading the disclosure of the specification. The present invention can also be implemented or applied by different specific embodiments, and the details in the specification can be modified or changed based on different viewpoints and applications without departing from the spirit of the present invention.

Embodiment 1

Figure 1:
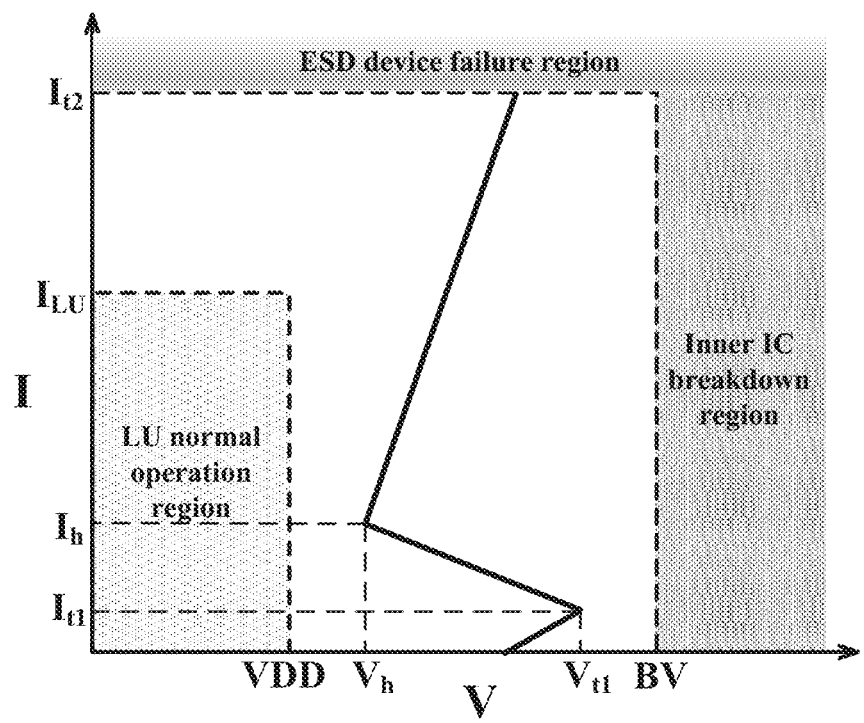
FIG. 1 (a) is a conventional ESD design window.
Figure 1:
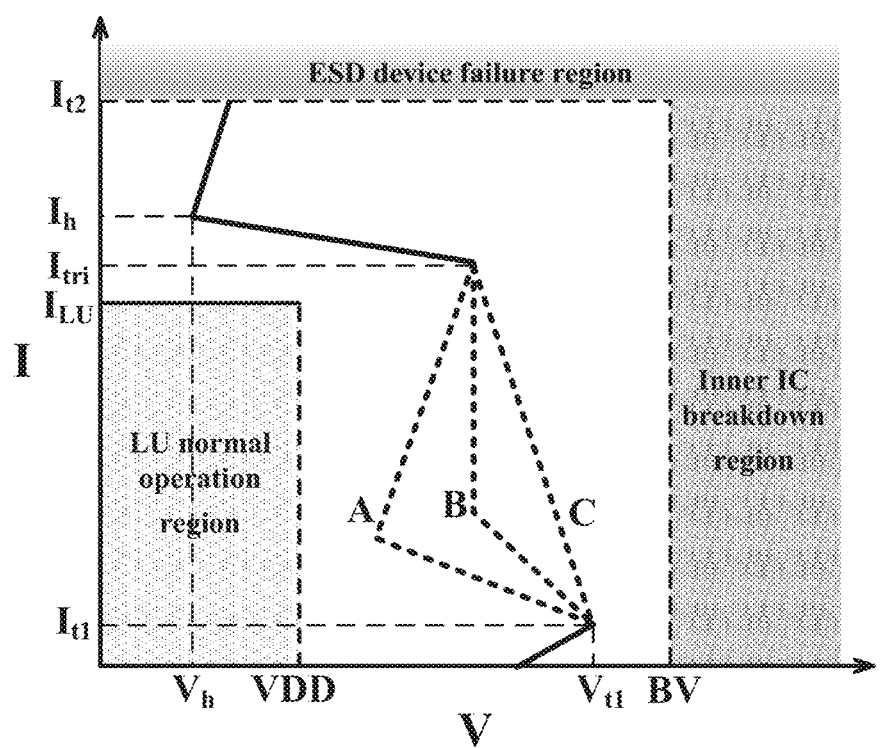
Figure 2:
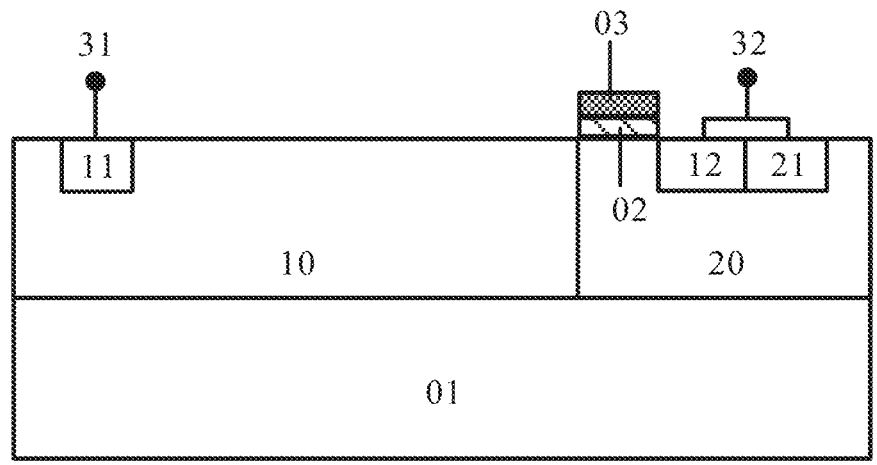
FIG. 2 is a structural view of conventional LDMOS device.
Figure 3:
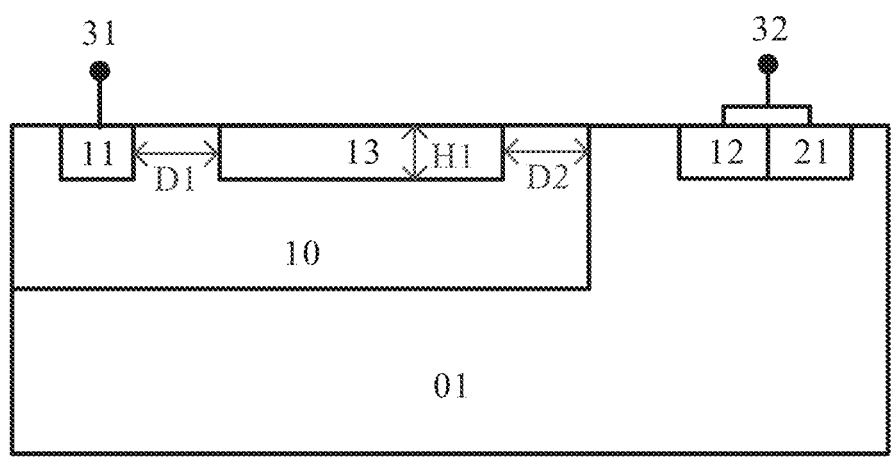
FIG. 3 is a structural view of embodiment 1 according to the present invention.

FIG. 3 shows the structure of the device of the present embodiment which includes: P-type substrate 01, first NWELL region 10 located on the left of the upper part of P-type substrate 01, NP contact region 11 located in the upper part inside first NW ELL region 10, N+ contact region 12 on the right of the upper part of P-type substrate 01 apart from the first NWELL region 10, P+ contact region 21 tangent to the right side of N+ contact region 12; and NTOP layer 13 arranged at the right side ofN P contact region 11 inside first NWELL region 10. NP contact region 11 is connected to a first metal piece to form metal anode 31. N+ contact region 12 and P+ contact region 21 are connected by a second metal piece to form metal cathode 32.

The distance between NTOP layer 13 and NP contact region 11 (denoted as D1) and the distance between NTOP layer 13 and the right edge of first NWELL region 10 (denoted as D2) can be adjusted through the layout of process.

Mechanism of this Embodiment

When the ESD voltage rises, with NTOP layer 13, the PN junction formed by surface first NWELL region 10/P-type substrate 01 of the device is broken down first. After the breakdown, the hole current passes through P-type substrate 01 and is drawn away from P+ contact region 21 by metal cathode 32. Since there is an NTOP layer 13, most of the electron current after the breakdown will pass through the low-resistance region of the surface and be drawn away from NP contact region 11 by the anode. Further, since the junction depth of NTOP layer 13 on the surface is small, the collection efficiency of the collector of the surface NPN transistor is low, i.e., the current amplification factor β is small, so the $V_{sp}$ of the IV curve is high when snapback occurs for the first time. In addition, because the current is small, the Kirk effect is not obvious, the NWELL region of the D1 region will form a certain resistance, and the $V_{sp}$ is increased further. Therefore, the value of $V_{sp}$ can be adjusted by the size of D1. Since the current crowding occurs on the right side of NTOP layer 13, the Kirk effect occurs on the surface NPN transistor, and the peak of the electric field of the actual base/collector region is not at the PN junction formed by first NWELL region 10 and P-type substrate 01, but at the right side of NTOP layer 13. Since the D2 region has now been modulated by the strong crowding current, the change of D2 has little effect on the $V_{sp}$. Therefore, the size of D2 can independently adjust the value of the trigger voltage, which enables the adjustment of the trigger voltage.

As the ESD voltage continues to rise, the ratio of electron current passing through the N+ contact region 12, P type substrate 01 and the first NWELL region 10 begins to increase, i.e., NPN transistor in the body gradually turns on. When a large injection occurs, the Kirk effect also occurs in the NPN transistor in the body, so that the peak of the electric field in the base region is transferred from the junction of first NWELL region 10 and P-type substrate 01 at the time of small injection to the inner of first NWELL region 10. And the peak of the electric field continuously moves up until it is transferred to the lower surface of NP contact region 11. At this time, the base region of the internal NPN transistor has been expanded from its original P-type substrate 01 to P-type substrate 01 and first NWELL region 10. And with the enhancement of the Kirk effect of the internal NPN transistor, the current capacity of the internal NPN transistor continues to increase, and the current capacity of the surface NPN transistor is weakened. When the current of the surface NPN transistor is weakened into a small injection, the current capability of the internal NPN transistor is absolutely dominant, and the device undergoes a snapback phenomenon again. This time the snapback is like a conventional LDMOS and the voltage will be maintained at a value lower than VDD, but the electric current at this time is much higher than that of the conventional LDMOS.

If D2 is far away, the electric field becomes 0 before reaching the NTOP layer, then the breakdown voltage can reach the same level as LDMOS. A large part of the ESD trigger voltage is formed by the breakdown voltage, so this is the mechanism that the trigger voltage is adjustable. Due to the existence of a certain junction depth in the emitter region, the edge of the emitter region is sufficient to provide electrons to keep the device turned on in the case that the emitter current is not very high. This will cause most of the current to flow from the NTOP low-resistance region rather than flow to the bottom of the NW ELL region when entering the collector region. Although the NTOP region is a low-resistance region, due to the small area of the NTOP region, the collection efficiency of the collector region of the parasitic NPN transistor is very low, which leads to the increase of holding voltage $V_{h1}$ of the device.

With the increase of the ESD current, the Kirk effect of the internal NPN transistor is enhanced, the current capability of the internal NPN transistor is continuously increased, and the current capability of the surface NPN transistor is weakened. When that occurs a large number of electrons will be provided by the bottom of the NP contact region. Since the holding voltage is in the high-holding-voltage state at this time, the increased current will gradually transfer from the NTOP layer to the NWELL region where the holding voltage is lower, and the device holding voltage drops. However, this state can only occur when the current reaches a certain level. Therefore, if the current is not high enough, the device only can be maintained in a high voltage state.

Figure 8:
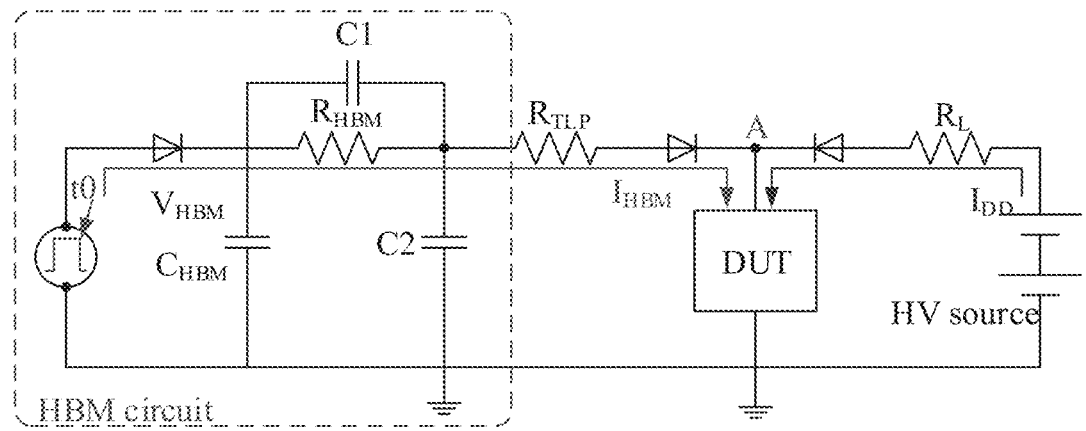
FIG. 8 is an HBM mixed simulation circuit diagram.

In order to prove that this device does not occur latch-up phenomenon when VDD is higher than its holding voltage, through circuit simulation, we can see the result as follows:

FIG. 8 is the simulation circuit diagram of the human body model (HBM). The HBM circuit in the dashed box on the left side of the circuit is used to simulate the ESD pulse waveform when a human body discharges static electricity. The right circuit is the power supply circuit of the device. The HV source is the power supply voltage, $R_L$ is the loading resistance, and the DUT is the testing module. Diodes are used to isolate the HBM circuit and the HV source circuit to ensure that the ESD pulse generated by the HBM circuit will not affect the HV source.

Figure 9:
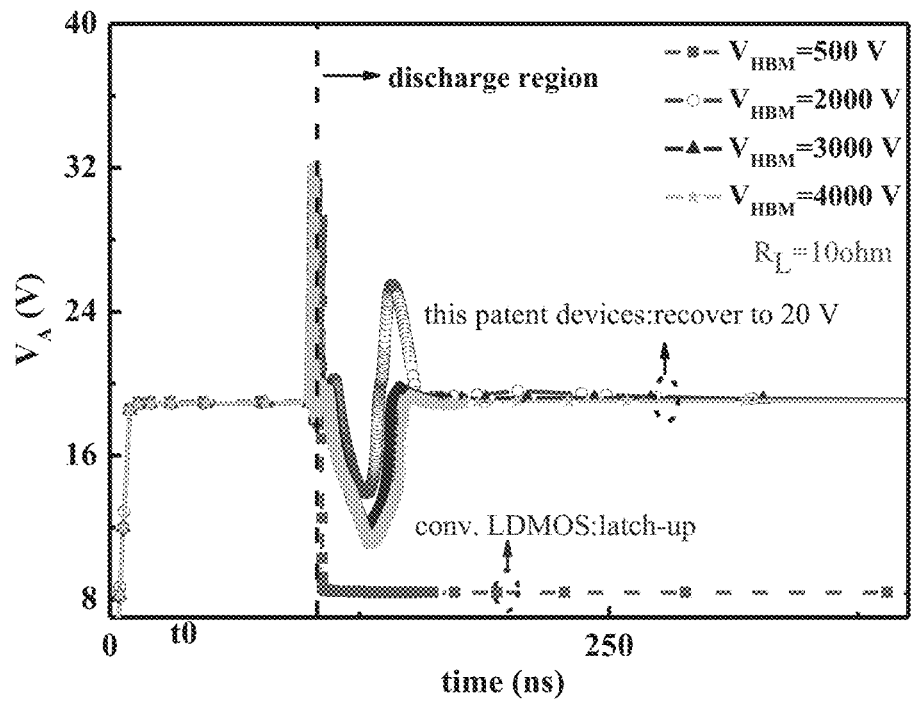
FIG. 9 shows the results of a time-domain simulation.

FIG. 9 shows the result curves of the latch-up immunity mixed simulation of embodiment 1, which is obtained by the simulation of the HBM circuit shown in FIG. 8. From this figure, it can be seen that after inputting the analog HBM waveform to the conventional device, the conventional device clamps to a lower voltage, resulting in latch-up. For the new device, although it will also be clamped to a voltage lower than the power supply voltage VDD for ESD discharge, the holding current $I_h$ of the new device is high, when the ESD pulse subsides, the whole loop current cannot be maintained above $I_h$ only by the supply voltage, so that latch-up immunity can be achieved. From this simulation, we can see that the new device of present invention can still be immune to latch-up even in the case of HBM=4000V, and the conventional device is already latch-up when HBM=500V.

Figure 10:
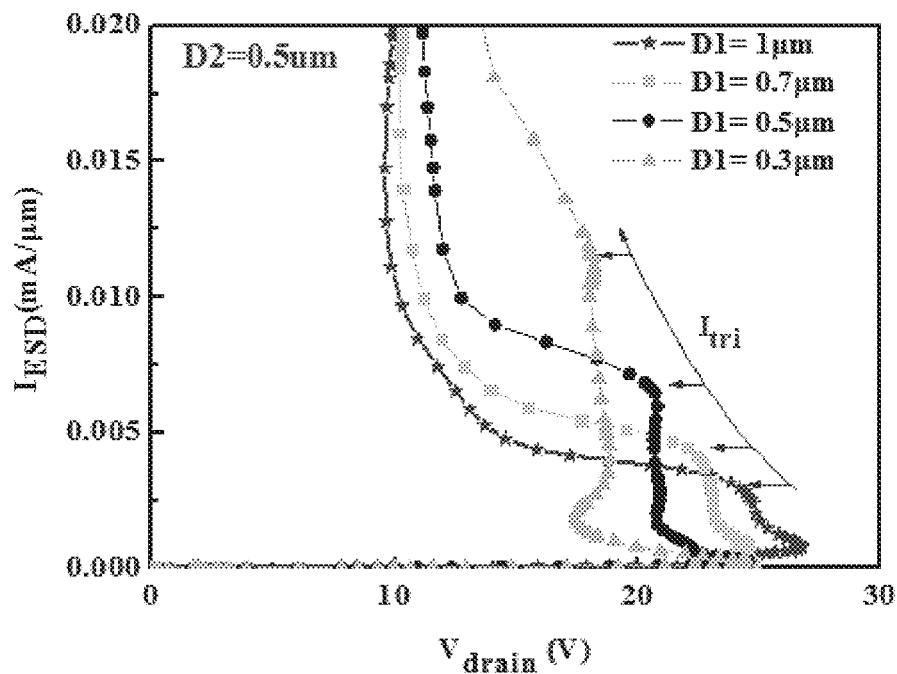
FIG. 10 shows the I-V characteristic simulation curves of embodiment 1 with different D1.

As shown in FIG. 10, in the case that the distance D2 between fixed NTOP layer 13 and the right edge of first NWELL region 10 is 0.5 μm, and the new devices of present invention with different D1 are simulated for IV curves by changing the distance D1 between NTOP layer 13 and NP contact region 11. This demonstrates that as the distance D1 between NTOP layer 13 and NP contact region 11 decreases, the trigger current $I_{tri}$ continuously increases. This is because as D1 decreases, the resistance on the current path of the surface NPN transistor becomes smaller, so that the current capability of the surface NPN transistor also increases, which means that a larger trigger current $I_{tri}$ is needed to make the current capability of the internal NPN transistor more dominant.

Figure 11:
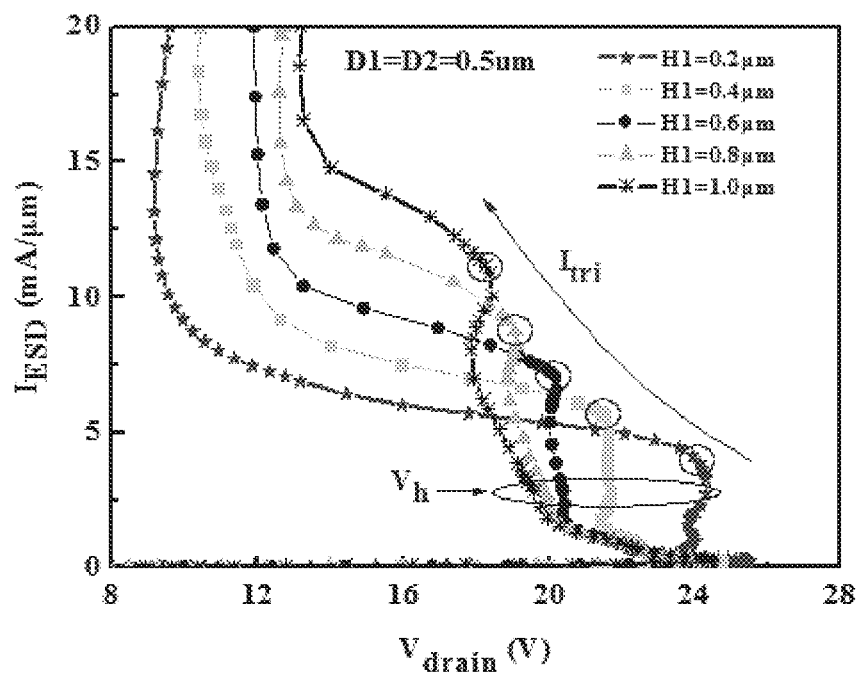
FIG. 11 shows the I-V characteristic simulation curves of embodiment 1 with different H1.

FIG. 11 is the schematic diagram of IV simulation with the different depths (H1) of NTOP layers 13. According to the mechanism of this embodiment, with the increase of H1, the current capability of the surface NPN transistor will also increase. And the internal NPN transistor will be more difficult to weaken the surface NPN transistor, which means that a larger $I_{tri}$ is needed to make the current capability of the internal NPN transistor more dominant. As illustrated in FIG. 11, as the depth H1 of the NTOP layer increases, the holding current $I_h$ of the device gradually increases while the trigger voltage hardly changes. This is consistent with the theoretical analysis.

Embodiment 2

Figure 4:
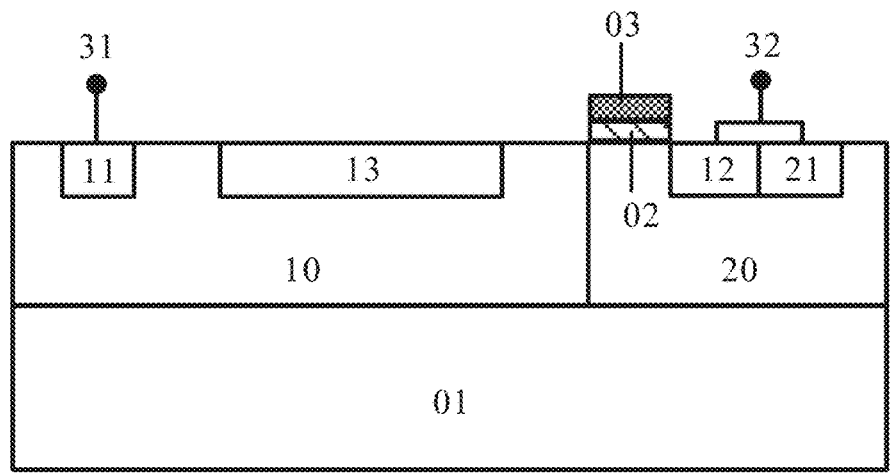
FIG. 4 is a structural view of embodiment 2 according to the present invention.

As shown in FIG. 4, the difference between the structure of the device of the present embodiment and the structure of the device of embodiment 1 is that: the right of the upper part of P-type substrate 01 is provided with first PWELL region 20, the left side of first PWELL region 20 is tangent to first NWELL region 10. N contact region 12 and P+ contact region 21 are located inside first PWELL region 20. The upper surface of first PWELL region 20 is provided with the gate oxide integration 02. The left side of the gate oxide integration 02 is tangent to first NWELL region 10, and the right side of the gate oxide integration 02 is tangential to N+ contact region 12. Polysilicon or metal gate 03 is arranged above the gate oxide integration 02 and polysilicon or metal gate 03 is connected to cathode 32 of the device through a wire.

Embodiment 3

Figure 5:
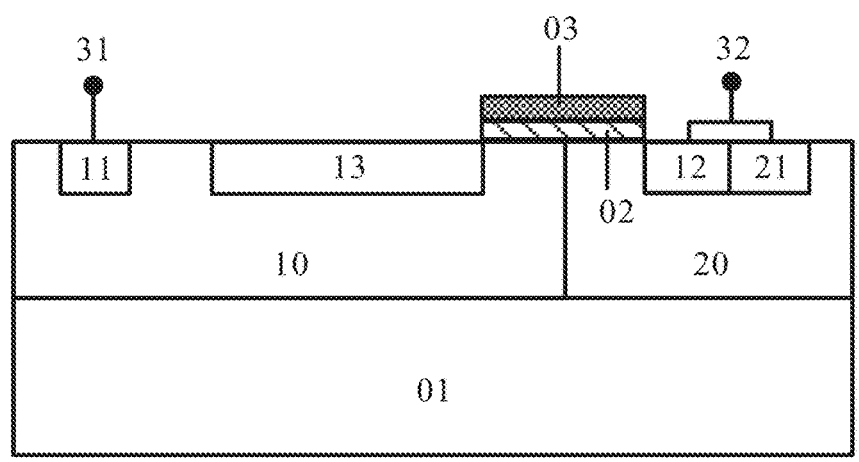
FIG. 5 is a structural view of embodiment 3 according to the present invention.

As shown in FIG. 5, the main difference between this embodiment and embodiment 2 is that the left side of gate oxide integration 02 intersects the first NWELL region 10 and is tangential to NTOP layer 13. The right side of the gate oxide integration 02 is tangent to N+ contact region 12. By doing so, a self-aligned technology can be applied to NTOP layer 13 and N+ contact region 12 in implementation.

Embodiment 4

Figure 6:
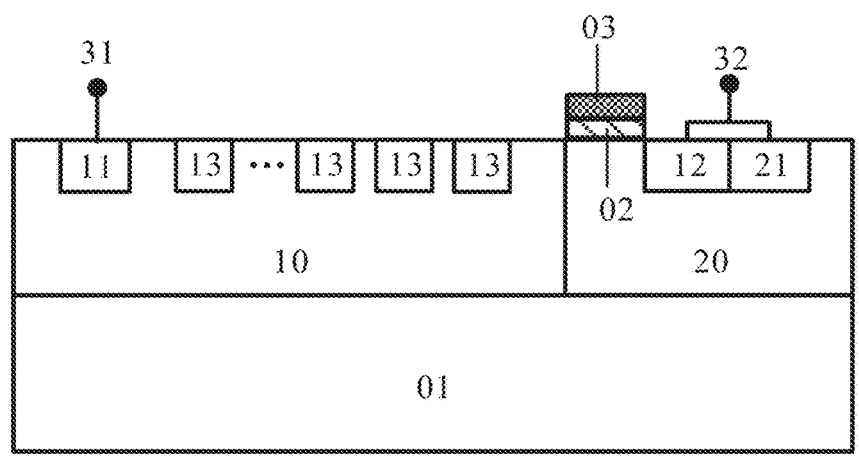
FIG. 6 is a structural view of embodiment 4 according to the present invention.

As shown in FIG. 6, the main difference between this embodiment and embodiment 3 is that the NTOP layer 13 is located on the upper surface of the first NWELL region 10 and includes a plurality of spaced regions that are arranged perpendicular to the cross section. The right edge of the rightmost NTOP layer 13 is located inside N WELL region 10.

Embodiment 5

Figure 7:
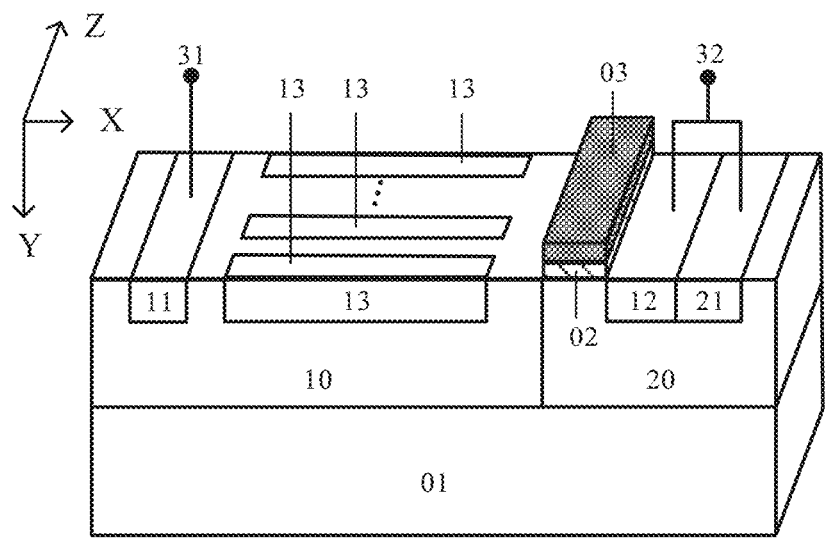
FIG. 7 is a structural view of embodiment 5 according to the present invention.

As shown in FIG. 7, the main difference between this embodiment and embodiment 4 is that: NTOP layer 13 includes a plurality of spaced regions which are arranged along the Z-axis and are parallel to each other.

Embodiment 6

Figure 12:
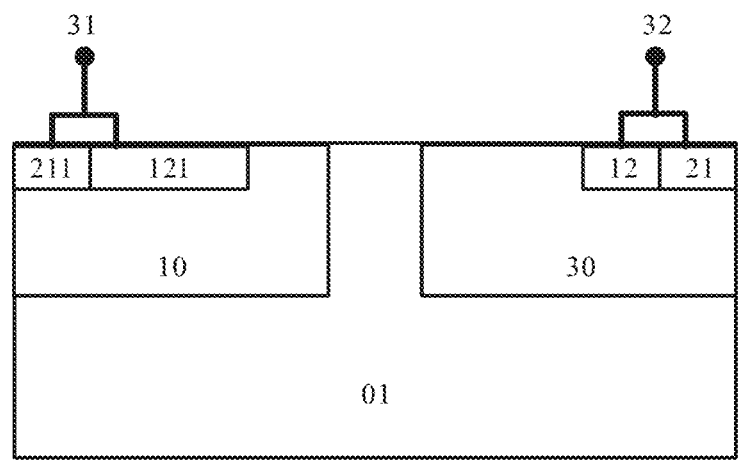
FIG. 12 is a structural view of embodiment 6 according to the present invention.

As shown in FIG. 12, the main difference between this embodiment and embodiment 1 is that the NP contact region 11 and NTOP layer 13 are connected to form the first N contact region 121. The left of the first N+ contact region 121 is provided with first P+ contact region 211 and right of first NWELL region 10 is provided with second NWELL region 30 apart from first NWELL region 10. N+ contact region 12 and P+ contact region 21 are located inside second NWELL region 30. First N+ contact region 121 and first P+ contact region 211 are shorted to form the metal anode 31. N+ contact region 12 and P+ contact region 21 are connected by metal to form metal cathode 32.

Embodiment 7

Figure 13:
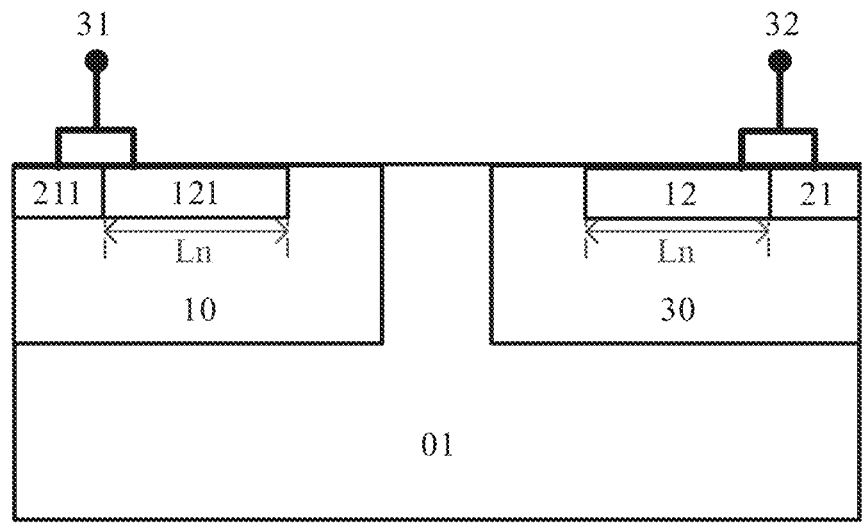
FIG. 13 is a structural view of embodiment 7 according to the present invention.

As shown in FIG. 13, the main difference between this embodiment and embodiment 6 is that first NWELL region 10 and second NWELL region 30 and their internal structures are symmetrical about the central axis of the device.

Figure 18:
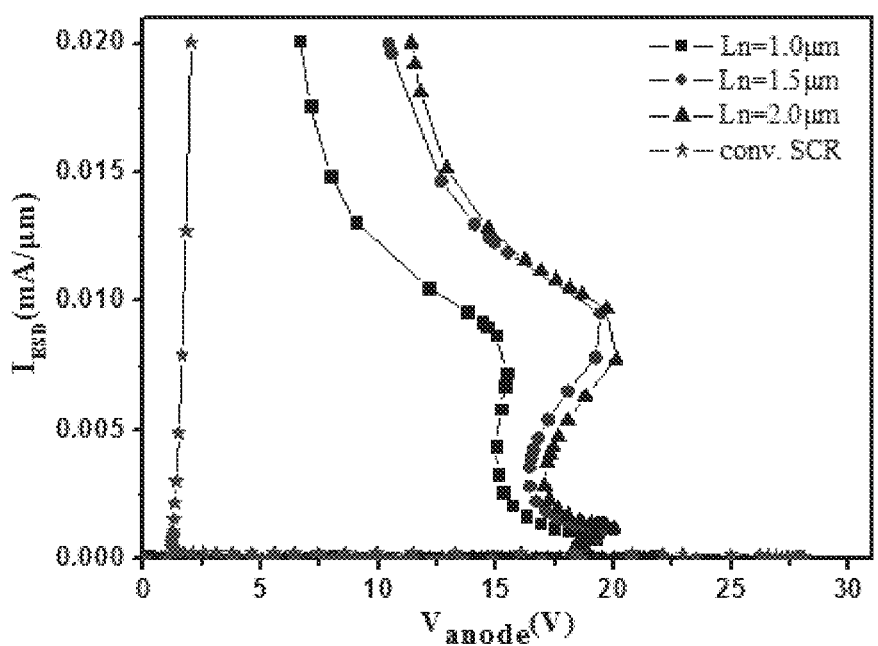
FIG. 18 shows the I-V characteristic simulation curves of embodiment 6 with different Ln and the I-V characteristic simulation curves of conventional device.

The main characteristic of this device is that first N+ contact region 121 and N+ contact region 12 extend beyond the metal electrode. The beneficial effect is that the turn-on voltage drop of the surface NPN transistor can be reduced, so that if a small current is used, the surface NPN transistor would be turned on first. At the same time, the recombination of surface holes would be enhanced, as the device current would be longitudinal, and the robustness would be improved. That is, by adjusting the lengths of first N+ contact region 121 and N+ contact region 12, the device's holding voltage and trigger current ($I_{tri}$) can be changed, thereby making the design more flexible. The simulation results of the devices with different lengths of first N+ contact region 121 and N+ contact region 12 are shown in FIG. 18.

In addition, the device has a function of bidirectional ESD protection, i.e., whether the ESD signal of metal anode 31 is a positive pulse or a negative pulse, it can be discharged through the device. Compared with the ESD protection device with a high holding voltage, the device can discharge the ESD signal with a holding voltage lower than the power supply voltage VDD, and therefore its conduction power is lower and its robustness is higher.

Mechanism of this Embodiment

When the ESD voltage of metal anode 31 rises, since surface N+ contact regions 121 and 12 are longer, the on-resistance of the path is smaller, so that the ESD signal would be discharged from the surface NPN transistor first and the first snapback would occur when the device breaks down. As the ESD current increases, when the voltage drops of the parasitic resistance flowing through N+ contact region 121 and first NWELL region 10 reaches 0.7V, the PN junction formed by first P+ contact region 211 and first NWELL region 10 would be turned on. Then the PNP transistor formed by first P+ contact region 211, first NWELL region 10 and the P-type substrate 01 would be turned on and discharged by the ESD signal, and the snapback would occur in the device again.

As the ESD current continues to increase, enough holes are created in the second NWELL region 30 from first P+ contact region 211, causing the Kirk effect to occur in first NWELL region 10 and gradually causing entire first NWELL region 10 to be conductance modulated to a P-type region. When the ESD current continues to increase, the Kirk effect also occurs in the second NWELL region 30, and the current capability of the internal channel of the device is stronger than that of the surface channel of the device. Therefore, the current path is gradually transferred from the surface to the body, and the snapback occurs in the device again.

Figure 17:
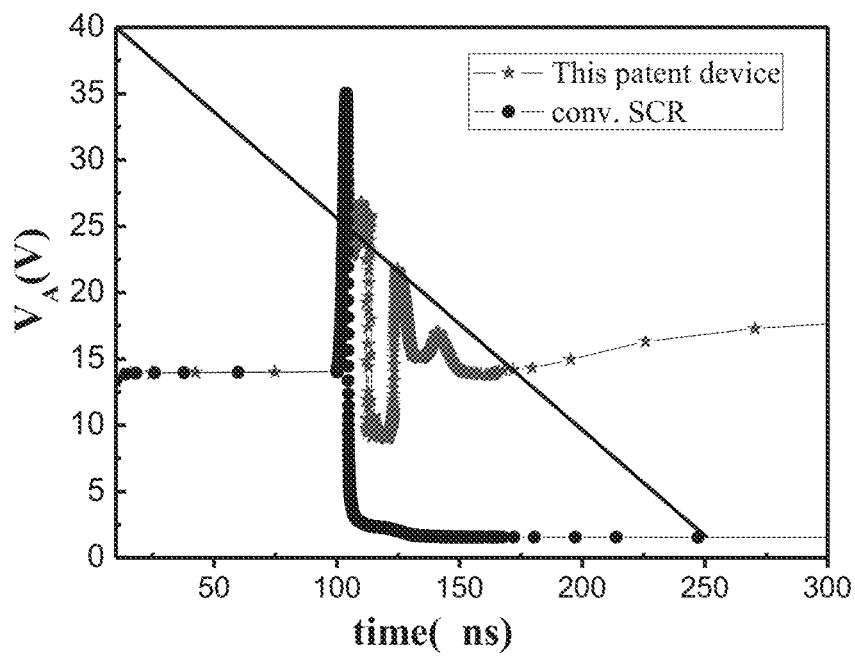
FIG. 17 shows the results of a time-domain simulation of embodiment 6.

FIG. 17 is the result curves of the latch-up immunity mixed simulation of embodiment 6, which is obtained by the simulation of the HBM circuit shown in FIG. 8. Among them, the power supply voltage VDD of the simulation equals 15V, when time is 100 ns, the HBM circuit produces the ESI) pulse, and this pulse lasts approximately 150 ns. FIG. 17 illustrates the conventional SCR will experience latch-up under the HBM pulse, or after 150 ns, the power supply voltage is clamped by the SCR at about 2V but cannot be recovered to 15V. In the present invention, when time is 120 ns, the clamping voltage is about 8V, that is, the ESD is discharged below the power supply voltage; but after 150 ns, the power supply voltage is recovered to 15V, which shows that the present invention can achieve the goal of latch-up immunity.

FIG. 18 is the I-V simulation diagram corresponds with the varying length(s) of the N+ contact regions. As can be seen from FIG. 18, as the length of the N+ contact region increases, the device's holding voltage and trigger current (l) will also increase. The SCR in the figure is the conventional silicon controlled rectifier. The conventional SCR has only one snapback, and both the holding voltage and the holding current are very low.

Embodiment 8

Figure 14:
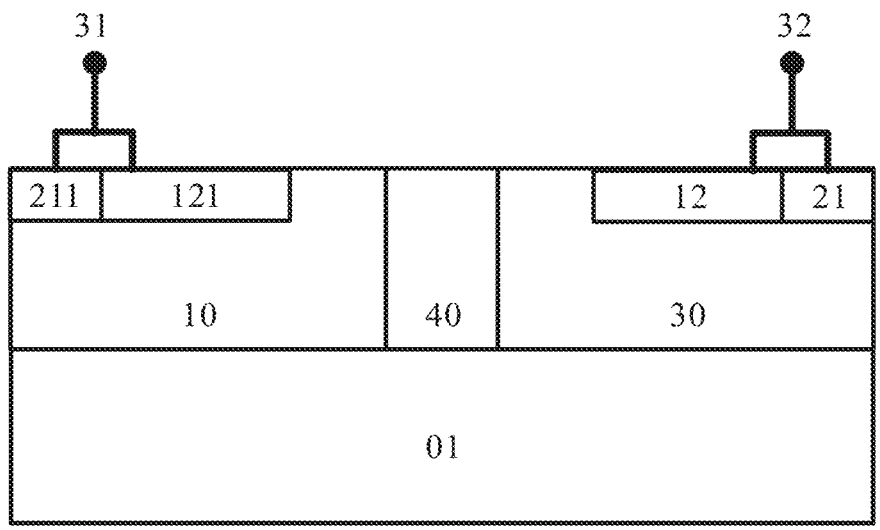
FIG. 14 is a structural view of embodiment 8 according to the present invention.

As shown in FIG. 14, the main difference between this embodiment and embodiment 7 is that: second PWELL region 40 is arranged between first NWELL region 10 and second NWELL region 30. The left edge of second PWELL region 40 is tangential to first NWELL region 10, and the right edge of second PWELL region 40 is tangential to the second NWELL region 30.

Embodiment 9

Figure 15:
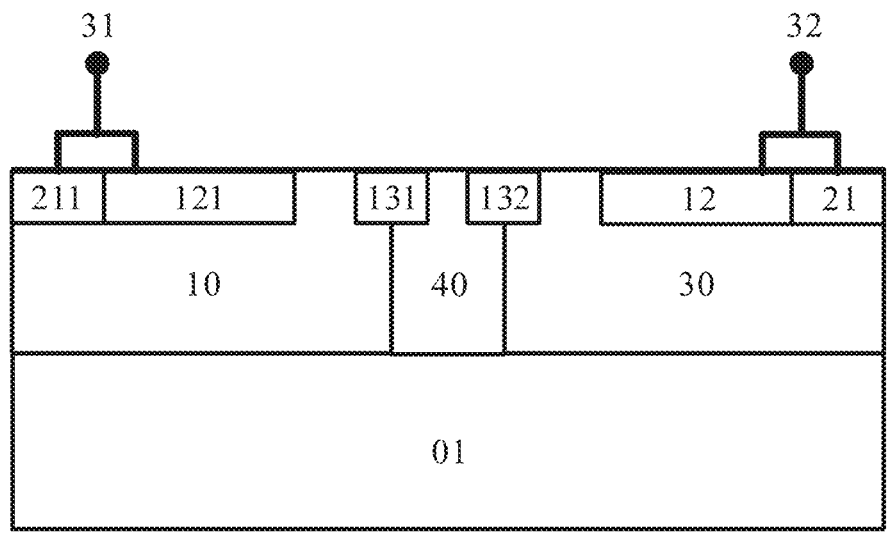
FIG. 15 is a structural view of embodiment 9 according to the present invention.

As shown in FIG. 15, the main difference between this embodiment and embodiment 8 is that first low-trigger region 131 is arranged on the upper surface of the boundary between first NWELL region 10 and second PWELL region 40. A part of first low-trigger region 131 is located inside of the first NWELL region 10, and the other part of first low-trigger region 131 is located inside of the second PWELL region 40. Symmetrically, second low-trigger region 132 is arranged on the upper surface of the boundary between second NWELL region 30 and second PWELL region 40. A part of second low-trigger region 132 is located inside of second NWELL region 30, and the other part of second low-trigger region is located in second PWELL region 40.

Embodiment 10

Figure 16:
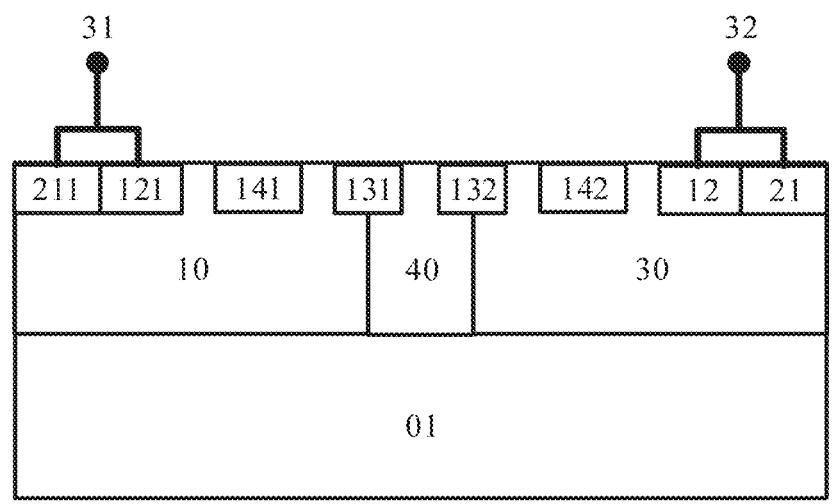
FIG. 16 is a structural view of embodiment 10 according to the present invention.

As shown in FIG. 16, the main difference between this embodiment and embodiment 9 is that first NTOP region 141 is arranged between first N+ contact region 121 and first low-trigger region 131. First NTOP region 141 is located on the upper surface of first NWELL region 10 and is not tangential to first N+ contact region 121 and first low-trigger region 131, simultaneously. Symmetrically, second NTOP region 142 is arranged between N+ contact region 12 and second low-trigger region 132. Second NTOP region 142 is located on the upper surface of second NW ELL region 30, and second NTOP region 142 is not tangential to N+ contact region 12 and second low-trigger region 132, simultaneously.

The above-mentioned embodiments are merely used to demonstrate the principle and effect of the present invention and are not intended to limit the present scope of the invention. Any person skilled in the art may modify or change the above-mentioned embodiments without departing from the spirit and scope of the present invention. Therefore, any equivalent modification or change derived by those having common knowledge in the art without departing from the spirit and technical thoughts disclosed by the invention shall be considered as covered by the appended claims of the present invention.

What is claimed is:

1. A high voltage ESD protection device, comprising:
a P-type substrate;
a first NWELL region located on the left of an upper part of the P-type substrate;
a NP contact region located at an upper part inside the first NWELL region;
a N+ contact region located on the right of the upper part of the P-type substrate apart from the first NWELL region;
a P+ contact region tangent to a right side of the N+ contact region; wherein the right side of the NP contact region within the first NWELL region is provided with a NTOP layer,
the NP contact region is connected to a first metal piece to form a metal anode; and
the N+ contact region is connected to the P+ contact region through a second metal piece to form a metal cathode:
a size and a position of the NTOP layer in the first NWELL region affect a trigger voltage and holding current of the device, wherein a distance between the NTOP layer and the NP contact region (DI) decreases, the trigger current continuously increases; the size of the distance between the NTOP layer and the right edge of the first NWELL region (D2) independently adjusts the value of the trigger voltage; and when the junction depth of the NTOP layer (H1) increases, the holding current of the device gradually increases while the trigger voltage hardly changes; by adjusting D, D2 and H1 individually or simultaneously, a holding voltage is lower than VDD and the holding current is higher than latch-up current.

2. The high voltage ESD protection device according to claim 1, wherein a first PWELL region is arranged on the right of the upper part of the P-type substrate, and a left side of the first PWELL region is tangential to the first NWELL region, and the N+ contact region and the P+ contact region are located inside the first PWELL region.

3. The high voltage ESD protection device according to claim 2, wherein an upper surface of the first PWELL region is provided with a gate oxide integration; a left side of the gate oxide integration is tangential to the first NWELL region or the NTOP layer; a right side of the gate oxide integration is tangential to the N+ contact region; and a polysilicon or metal gate is provided on the gate oxide integration.

4. The high voltage ESD protection device according to claim 1, wherein the NTOP layer is a continuous region.

5. The high voltage ESD protection device according to claim 1, wherein the NTOP layer is located on an upper surface of the first NWELL region and comprises multiple discontinuous regions.

6. The high voltage ESD protection device according to claim 1, wherein the NP contact region and the NTOP layer are connected together to form a first N+ contact region; a left of the first N+ contact region is provided with a first P+ contact region; a right side of the first NWELL region is provided with a second NWELL region apart from the first NWELL region; the N+ contact region and the P+ contact region are located inside the second NWELL region; the first N+ contact region and the first P+ contact region are shortened to form the metal anode, and the N+ contact region and the P+ contact region are connected by the second metal piece to form the metal cathode.

7. The high voltage ESD protection device according to claim 1, wherein the first NWELL region and the second NWELL region and internal structures of the first NWELL region and the second NWELL region are symmetrical with respect to a central axis of the high voltage ESD protection device.

8. The high voltage ESD protection device according to claim 7, wherein a second PWELL region is arranged between the first NWELL region and the second NWELL region, a left edge of the second PWELL region is tangential to the first NWELL region, and a right edge of the second PWELL region is tangential to the second NWELL region.

9. The high voltage ESD protection device according to claim 8, wherein a first low-trigger region is arranged on an upper surface at a boundary of the first NWELL region and the second PWELL region, a first part of the first low-trigger region is located in the first NWELL region, and a second part of the first low-trigger region is located in the second PWELL region; symmetrically, a second low-trigger region is arranged on an upper surface at a boundary of the second NWELL region and the second PWELL region, a first part of the second low-trigger region is located in the second NWELL region, and a second part of the second low-trigger region is located in the second PWELL region.

10. The high voltage ESD protection device according to claim 9, wherein a first NNTOP region is arranged between a first N+ contact region and the first low-trigger region, a first NTOP region is located on an upper surface of the first NWELL region while the first NTOP region is not tangential to the first N+ contact region and the first low-trigger region, simultaneously; symmetrically, a second NTOP region is arranged between the N+ contact region and the second low-trigger region; the second NTOP region is located on an upper surface of a second NWELL region, and the second NTOP region is not tangential to the N+ contact region and the second low-trigger region, simultaneously.

\* \* \* \* \*